United States Patent
Tůma (10) Patent No.: US 11,417,493 B2
(45) Date of Patent: Aug. 16, 2022

(54) COUNTER POLE WITH PERMANENT MAGNETS

(71) Applicant: FEI Company, Hillsboro, OR (US)

(72) Inventor: Lubomír Tůma, Kanice (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/127,749

(22) Filed: Dec. 18, 2020

(65) Prior Publication Data

US 2022/0199354 A1 Jun. 23, 2022

(51) Int. Cl.
| | |
|---|---|
| H01J 37/14 | (2006.01) |
| H01J 37/143 | (2006.01) |
| H01J 37/21 | (2006.01) |
| H01J 37/20 | (2006.01) |
| H01J 37/145 | (2006.01) |
| H01J 37/28 | (2006.01) |

(52) U.S. Cl.
CPC .......... *H01J 37/143* (2013.01); *H01J 37/145* (2013.01); *H01J 37/20* (2013.01); *H01J 37/21* (2013.01); *H01J 37/28* (2013.01)

(58) Field of Classification Search
CPC ........ H01J 37/143; H01J 37/145; H01J 37/20; H01J 37/21; H01J 37/28
USPC ....................................... 250/307
See application file for complete search history.

(56) References Cited

U.S. PATENT DOCUMENTS

| | | | | |
|---|---|---|---|---|
| 2,926,254 A * | 2/1960 | Haine | .................. | H01J 37/153 313/452 |
| 5,677,530 A * | 10/1997 | Sato | ..................... | H01J 37/153 250/307 |
| 6,891,159 B2 * | 5/2005 | Khursheed | .............. | H01J 37/28 250/311 |
| 7,285,785 B2 * | 10/2007 | Buijsse | ................. | H01J 37/143 250/311 |
| 8,829,470 B2 * | 9/2014 | Tuma | ...................... | G21K 5/08 250/442.11 |
| 10,410,827 B2 * | 9/2019 | Mohammadi-Gheidari | | ............... G02B 21/06 |
| 11,257,659 B1 * | 2/2022 | Chen | ................... | H01J 37/1474 |
| 2004/0079884 A1 * | 4/2004 | Khursheed | ............. | H01J 37/28 250/311 |
| 2014/0110597 A1 | 4/2014 | Tuma et al. | | |

(Continued)

FOREIGN PATENT DOCUMENTS

| | | |
|---|---|---|
| DE | 4236273 A1 | 7/1993 |
| DE | 19915572 A1 | 10/1999 |

OTHER PUBLICATIONS

Extended European Search Report dated May 4, 2022, in European Patent Application No. 21212669.2 (9 pages).

*Primary Examiner* — Wyatt A Stoffa
(74) *Attorney, Agent, or Firm* — Klarquist Sparkman, LLP (57) ABSTRACT

A charged particle beam system can include a vacuum chamber, a specimen holder for holding a specimen within the vacuum chamber, and a charged particle column. The charged particle column can include a charged particle source for producing a beam of charged particles along an optical axis and a magnetic immersion lens for focusing the beam of charged particles. The magnetic immersion lens can include a first lens pole disposed adjacent a first surface of the specimen, an excitation coil surrounding the first lens pole, and a counterpole disposed adjacent a second surface of the specimen, the counterpole including one or more magnets disposed on the counterpole.

19 Claims, 6 Drawing Sheets

(56) References Cited

U.S. PATENT DOCUMENTS

2016/0027607 A1* 1/2016 Graupera ............... H01J 37/05
250/281
2018/0323036 A1* 11/2018 Mohammadi-Gheidari ...............
H01J 37/145
2020/0373115 A1* 11/2020 Mohammadi-Gheidari ...............
H01J 37/09

* cited by examiner

COUNTER POLE WITH PERMANENT MAGNETS

FIELD

The disclosure pertains to apparatus and methods for improved magnetic immersion lenses.

BACKGROUND

Charged particle beam systems are used in a variety of applications, including the manufacturing, repair, and inspection of miniature devices, such as integrated circuits, magnetic recording heads, and photolithography masks. Dual-beam systems typically include a scanning electron microscope (SEM) that can provide a high-resolution image with minimal damage to the target, and an ion beam system such as a focused or shaped beam system, that can be used to alter substrates (e.g., by milling) and to form images.

Generally, the final lens of an SEM is a charged particle beam (CBP) lens that produces a magnetic field (e.g., a magnetic immersion lens). The strength of such an immersion lens is limited by the saturation of the magnetic circuit and the source of the magnetic flux (e.g., a coil). Magnetic saturation is the state reached when continuing to increase an applied external magnetic field cannot increase the magnetization of the material any further, so the total magnetic flux density levels off. Accordingly, there is a continuing need for improved immersion lenses.

SUMMARY

In a representative embodiment, a charged particle beam system can include a vacuum chamber, a specimen holder for holding a specimen within the vacuum chamber, and a charged particle column comprising a charged particle source for producing a beam of charged particles along an optical axis and a magnetic immersion lens for focusing the beam of charged particles. The magnetic immersion lens can comprise a first lens pole disposed adjacent a first surface of the specimen, an excitation coil surrounding the first lens pole, and a counterpole configured to be disposed adjacent a second surface of the specimen, the counterpole including one or more magnets disposed on a surface of the counterpole.

In some embodiments, the surface of the counterpole is a first surface and wherein one or more additional magnets are disposed on a second surface of the counterpole.

In some embodiments, the counterpole comprises one or more recesses and wherein each magnet is disposed within a respective recess. In some embodiments, the recesses comprise tracks and the one or more magnets are slidable within the tracks such that the magnets can be positioned relative to the optical axis. The tracks can extend radially inwardly from an outer edge of the counterpole toward the optical axis and/or can extends circumferentially around the optical axis. In other embodiments, the one or more magnets can be coupled to the counterpole via an adhesive.

The counterpole can be mounted to a positioning system configured to allow movement of the counterpole between first and second positions within the vacuum chamber, wherein the counterpole is inactive in the first or second position. The counterpole can further comprise an aperture and a detector, the detector disposed within or below the aperture.

In some embodiments, the magnets can be disposed such that they compensate for asymmetry of the system. In other embodiments, the magnets can be disposed such that they create asymmetry in the system.

In another representative embodiment, the system can be a dual beam system comprising a specimen holder for holding a specimen, an ion beam column configured to direct an ion beam to the specimen, and a charged particle column comprising a charged particle source for producing a beam of charged particles along an optical axis and a magnetic immersion lens for focusing the beam of charged particles. The magnetic immersion lens can comprise a first lens pole disposed adjacent a first surface of the specimen, and a second lens pole disposed adjacent a second surface of the specimen, the second lens pole comprising one or more magnets. In some embodiments, the magnetic immersion lens can be coupled to a control unit.

A method of using a dual beam system can include disposing the magnets about the optical axis to create asymmetry within the system.

The foregoing and other objects, features, and advantages of the disclosure will become more apparent from the following detailed description, which proceeds with reference to the accompanying figures.

DETAILED DESCRIPTION

Introduction

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example.

In an SEM, irradiation of a substrate by a scanning electron beam produces "auxiliary" radiation from the substrate, in the form of secondary electrons, backscattered electrons, transmitted electrons, X-rays, and cathodoluminescence (infrared, visible, and/or ultraviolet photons). For example, one or more components of this auxiliary radiation can be detected and used for imaging. As an alternative to the use of electrons as an irradiating beam, charged particle microscopy can also be performed using other species of charged particle. In this respect, the phrase "charged particle" should be broadly interpreted as encompassing electrons, positive ions (e.g., Ga or Xe ions), negative ions, protons, and positrons, for instance. In addition to imaging and performing localized surface modification (e.g., milling, etching, deposition, etc.), a charged particle microscope can also have other functionalities, such as performing spectroscopy, examining diffractograms, etc.

In some examples, ion beam components are used to mill associated spots in a test substrate such as a silicon substrate. As used herein, "image" refers to a visual image as well as a digital or other stored representation of a visual image.

Generally, the final lens of an SEM is a charged particle beam (CBP) lens such as an electrostatic, magnetic, or combined lens. In the case of a magnetic immersion lens, the strength and often the imaging quality of such an immersion lens is limited by the saturation of the magnetic circuit and the source of the magnetic flux (e.g., a coil). Permanent magnets can be used in conjunction with the coil of CBP lens to add additional flux to the magnetic circuit and/or to introduce or compensate for asymmetry in the system, thereby improving the resolution of the lens.

As used herein, the singular forms "a," "an," and "the" include the plural forms unless the context clearly dictates otherwise. Additionally, the term "includes" means "comprises." Further, the term "coupled" does not necessarily exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Example 1

Figure 1:
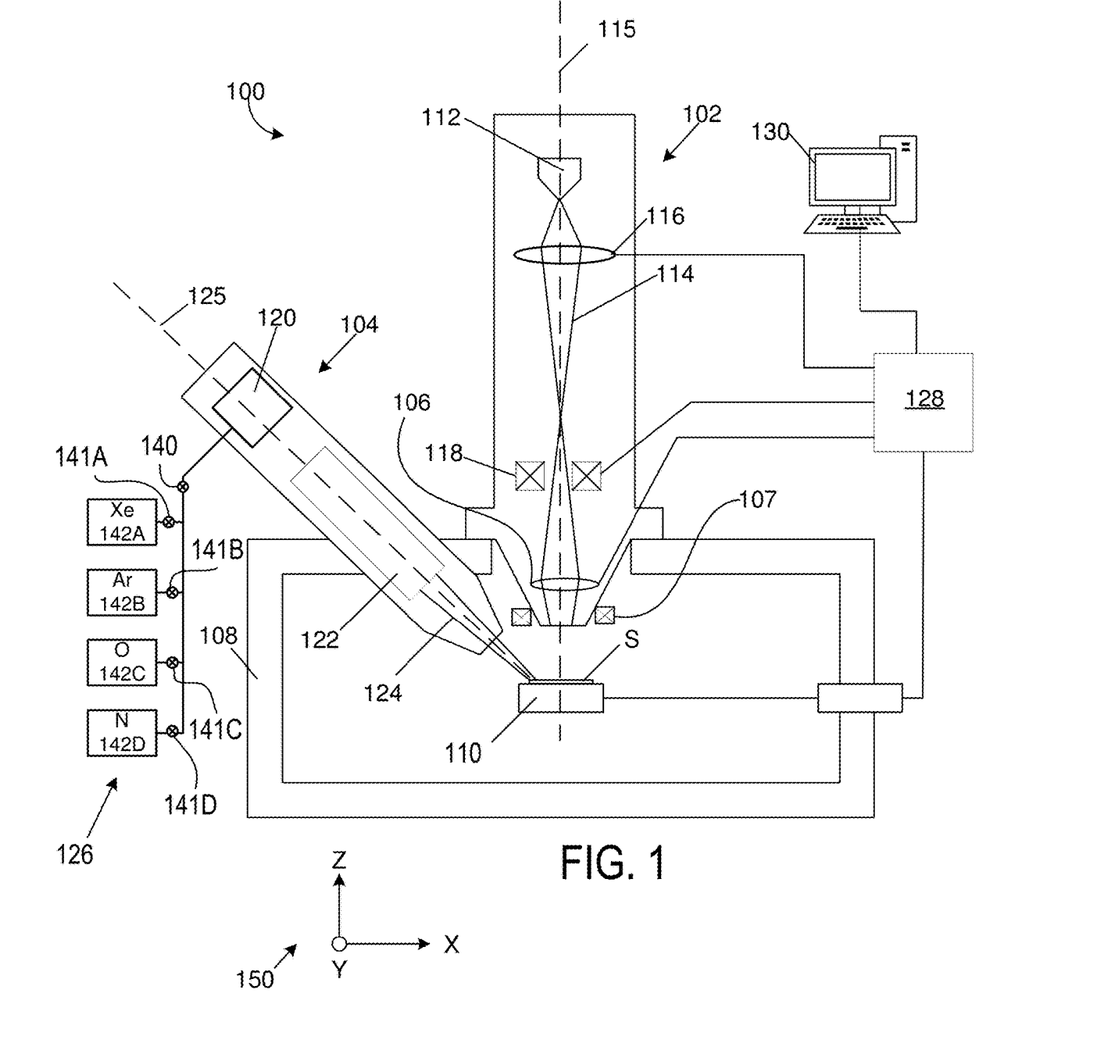
FIG. 1 illustrates a representative dual-beam system.

FIG. 1 illustrates a representative embodiment of a dual-beam system 100 comprising a scanning electron microscope (SEM) 102 and an ion beam column 104. The SEM 102 can comprise one or more charged particle beam (CPB) lenses such as a condenser lens 116 and an objective lens 106. In some embodiments, one or more CPB lenses can be magnetic lenses, and particularly, the objective lens 106 can be a magnetic objective lens (e.g., a magnetic immersion objective lens). The ion beam column is arranged to provide a focused ion beam (FIB) to a sample S, and the SEM 102 is situated for production of an image of the sample S. The SEM 102 and the ion beam column 104 can be mounted to a vacuum chamber 108 housing a movable substrate holder 110 for holding a sample S. The vacuum chamber 108 can be evacuated using vacuum pumps (not shown). The substrate holder 110 can be movable in the X-Y plane as shown with respect to a coordinate system 150, wherein a Y-axis is perpendicular to a plane of the drawing. The substrate holder can further move vertically (along a Z-axis) to compensate for variations in the height of the sample S.

In some embodiments, the SEM 102 can be arranged vertically above the sample S and can be used to image the sample S, and the ion beam column 104 can be arranged at an angle and can be used to machine and/or process the sample S. FIG. 1 shows an exemplary orientation of the SEM 102 and the ion beam column 104.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. One or more CPB lenses of SEM column 102, such as the condenser lens 116 and the objective lens 106, focus the beam 114 onto the sample S. In some embodiments, the SEM 102 can be provided with a deflection unit 118 that can be configured to steer the beam 114. For example, the beam 114 can be steered in a scanning motion (e.g., a raster or vector scan) across a sample being investigated.

In some embodiments, as shown in FIG. 1, the dual beam system 100 can further comprise a magnetic field generating coil 107 disposed in order to provide additional magnetic field creating an additional immersion magnetic lens, thereby improving the resolution of the SEM optical system.

The dual-beam system 100 can further comprise a computer processing apparatus and/or a control unit 128 for controlling inter alia the deflection unit 118, CPB lenses 106, 116, and detectors (not shown), and for displaying information gathered from the detectors on a display unit. In some cases, a control computer 130 is provided to establish various excitations, record imaging data, and generally control operation of both the SEM and the FIB.

The ion beam column 104 can comprise an ion source (e.g., a plasma source 120) and ion beam optics 122. In the illustrated embodiment, the ion beam column 104 is a plasma focused ion beam (PFIB), however, in other embodiments, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing and/or machining operations on the substrate, such as incising, milling, etching, depositing, etc.

In embodiments where the ion beam is a PFIB, the ion source 120 can be fluidly coupled to a plurality of gases via a gas manifold 126 that includes gas sources 142A-142D coupled by respective valves 141A-141D to the ion source 120. A valve 140 is situated to selectively couple gases from the gas manifold 126 to the ion source 120. Exemplary gases include, but are not limited to, xenon, argon, oxygen, and nitrogen as shown in FIG. 1. During operation of the ion source 120, a gas can be introduced, where it becomes charged or ionized, thereby forming a plasma. Ions extracted from the plasma can then be accelerated through the ion beam column 104, becoming an ion beam.

Example 2

Figure 2:
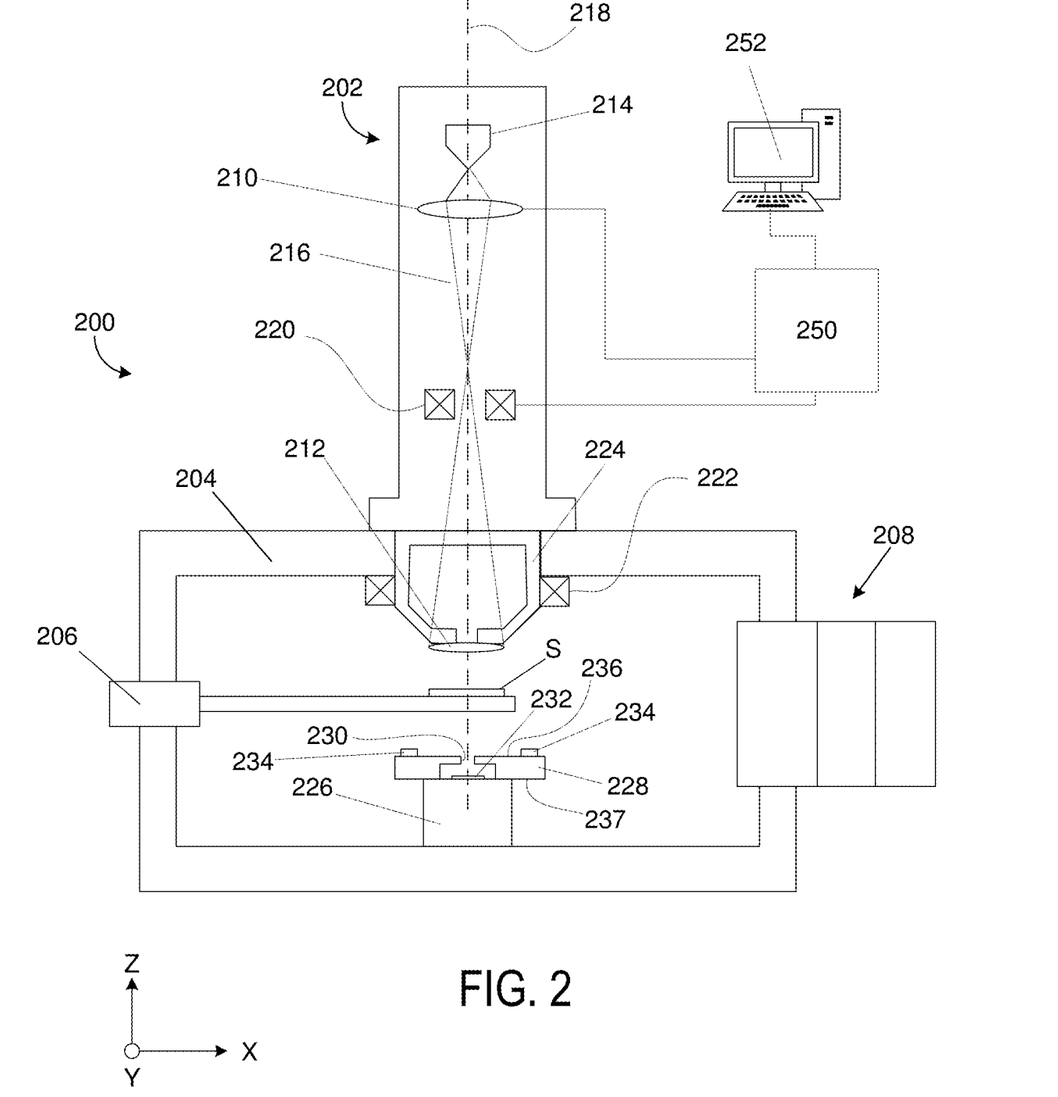
FIG. 2 illustrates a representative SEM system comprising a magnetic immersion objective lens.

In another representative embodiment, a system 200 can comprise a scanning electron microscope (SEM) 202 mounted on a vacuum chamber 204. The vacuum chamber 204 can house a first movable stage 206 for holding a sample S. The sample S can be introduced through a load lock 208. The vacuum chamber 202 can be evacuated using vacuum pumps (not shown).

The SEM 202 can comprise one or more CPB lenses such as a condenser lens 210 an objective lens 212. In some embodiments, the one or more CPB lenses can be magnetic lenses, and particularly, the objective lens 212 can be a magnetic objective lens (e.g., a magnetic immersion objective lens). In some embodiments, the SEM 202 can be arranged vertically above the sample S and can be used to image the sample S. The SEM 202 can comprise an electron source 214 and can be configured to manipulate a "raw" radiation beam from the electron source 214 and perform upon it operations such as focusing, aberration mitigation, cropping (using an aperture), filtering, etc. The SEM 202 can produce a beam 216 of input charged particles (e.g., an electron beam) that propagates along a particle-optical axis 218. The SEM 202 can generally comprise one or more CPB lenses such as the condenser lens 210 and the objective lens 212, to focus the beam 216 onto the sample S. In some embodiments, the SEM 202 can be provided with a deflection unit 220 that can be configured to steer the beam 216. For example, the beam 216 can be steered in a scanning motion (e.g., a raster or vector scan) across a sample S being investigated. The objective lens 212 can comprise an excitation coil 222 surrounding a first pole 224 of the lens 212 for generating a focusing magnetic field in the gap between the first lens pole 224 and the sample S.

The system 200 can further comprise a computer processing apparatus and/or a control unit 250 for controlling inter alia the deflection unit 220, charged particle beam (CPB) lenses 210, 212, and detectors, and for displaying information gathered from the detectors on a display unit 252 (e.g., a computer, mobile device, etc.).

As mentioned above, the objective lens 212 is a magnetic immersion objective lens comprising excitation coil 222. However, the strength of the magnetic immersion lens 212 is limited by the maximum magnetomotive force generated by the coil 222. The disclosed embodiments provide a solution to this problem by adding magnetomotive force to the lens 212 via a second lens pole and one or more permanent magnets which generate an additive magnetic field. Such embodiments can be used for STEM operation (e.g., high resolution, high voltage STEM) and/or in conventional SEM modes when using secondary or backscattered electrons.

The system 200 can comprise a second movable stage 226 comprising a second lens pole 228 (also referred to as a counterpole 228) disposed adjacent the substrate S (e.g., beneath the substrate in the orientation shown in FIG. 2). The first stage 206 can be a stage such as used in transmission electron microscopy (TEM) and the second stage 226 can be a conventional SEM or dual bean stage (see e.g., FIG. 5). The counterpole 228 can comprise a central aperture 230 and a detector 232 disposed below the aperture 230. If the sample S is sufficiently thin (e.g., preferably below 50 nm for semiconductor materials and below 100 nm for biological materials) electrons can travel through the sample S and be detected by the detector 232. The angular distribution of the scatter angle of the detected electrons can provide information about the sample S. In some embodiments, the detector 232 can be, for example, a High Angle Annular Dark Field Detector (HAADF detector), an Annular Dark Field Detector (ADF detector), and/or a Bright Field detector, etc.

One or more magnets 234 can be coupled to the counterpole to enhance the performance (e.g., improve the resolution) of the magnetic immersion objective lens 212. The magnets 234 can be permanent magnets (e.g., permanent neodymium magnets or permanent samarium cobalt magnets). Permanent magnets 234 create their own persistent magnetic field at a predetermined excitation. In some particular embodiments, the addition of permanent magnets 234 to the counterpole 228 is equivalent to adding about 1500 AT (Ampere-turns) of excitation to the coil 222.

In other particular embodiments, the addition of permanent magnets can enable higher beam energy by raising the strength of the magnetic field. Magnets add magnetic flux into the magnetic circuit, raising the strength of the magnetic field. A higher magnetic field allows for use of a higher energy electron beam.

Further details of the advantages of permanent magnets in electron microscopy can be found, for example, in Hawkes et al, *Principles of Electron Optics Volume Two: Applied Geometrical Optics*, Academic Press ($2^{nd}$ Ed.) (2017), which is incorporated by reference herein in its entirety.

In other embodiments, each magnet 234 can be an electromagnet comprising a respective current-carrying coil.

In some particular embodiments, the sample S can be placed on a surface of the counterpole 228. The magnets 234 can be disposed laterally adjacent the specimen to enable magnetic immersion for systems without an immersion lens coil.

The magnets 234 can be disposed around the optical axis 218. In some embodiments, the magnets 234 can be disposed symmetrically about the axis 218. In other embodiments, the magnets 234 can be placed asymmetrically about the axis 218 to, for example, introduce desired asymmetry or compensate for undesired asymmetry of other components of the optical system. The magnets 234 can be disposed on one or more surfaces of the counterpole 228. For example, in the illustrated embodiment, the magnets 234 are disposed on a first surface 236 of the counterpole adjacent the sample S (e.g., the upper surface in the orientation shown in FIG. 2). In other embodiments, in lieu of or in addition to disposing magnets 234 on the first surface 236, one or more magnets 234 can be disposed on a second surface 237 of the counterpole (e.g., the lower surface in the orientation shown in FIG. 2). Though in the illustrated embodiment the magnets 234 are disposed beneath the specimen S (in the orientation shown in FIG. 2), in other embodiments, the magnets 234 can be disposed laterally adjacent the sample S. In still other embodiments, the magnets 234 can be placed above the sample in the orientation shown in FIG. 2.

Though the illustrated embodiments show only a single magnet 234 disposed at each circumferential location about the optical axis, in other embodiments, the magnets 234 can be stacked on top of one another such that one or more magnets can be disposed at a selected circumferential location. In some such embodiments, the magnets can be coupled to one another using, for example, an adhesive. In other embodiments, the magnets can have interlocking shapes.

Figure 3:
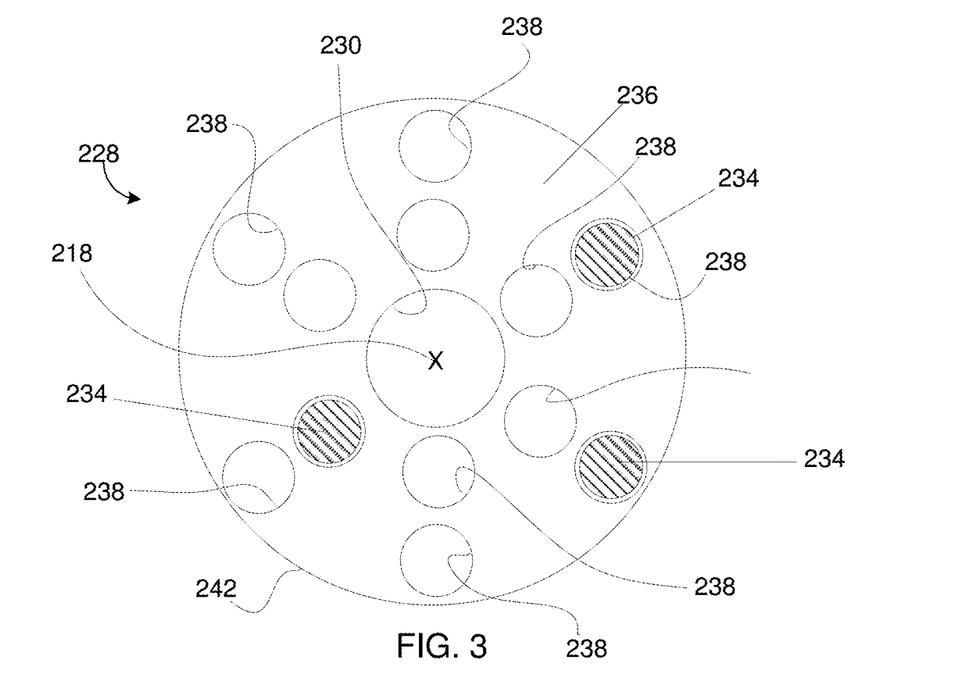
FIG. 3 is a top plan view of an embodiment of a counterpole for an SEM system.

Referring to FIG. 3, which illustrates a top down view of the counterpole 228, the surface 236 of the counterpole 228, disposed adjacent the sample S (e.g., the upper surface in the orientation shown in FIG. 2), can comprise one or more grooves or recesses 238 in which the magnets 234 can be disposed. In some embodiments, each recess 238 can be configured (e.g., sized and shaped) to prevent inadvertent movement of the magnets 234 relative to the counterpole 228 (e.g., during movement of the counterpole 228) such that they remain in a desired location and/or retain a selected configuration relative to the optical axis 218. In some embodiments each recess can have a shape corresponding to the shape of a respective magnet. For example, in the illustrated embodiment, each recess 238 has a circular shape in cross-section corresponding to the circular shape of the magnets 234.

Figure 5:
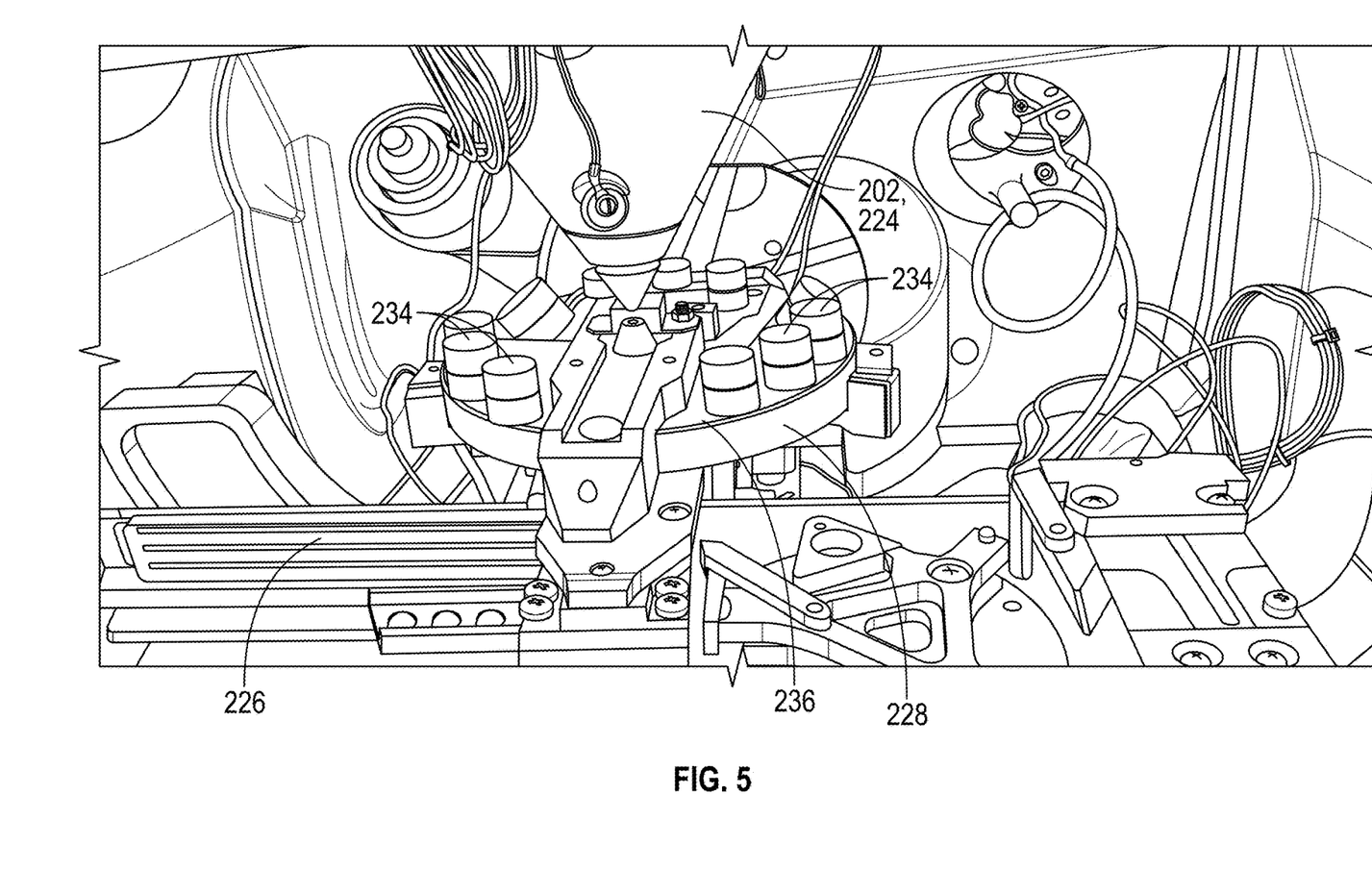
FIG. 5 is a perspective view of a portion of a representative SEM system comprising a plurality of permanent magnets.

In other embodiments, as shown in FIG. 5, the magnets 234 can be disposed directly on the first surface 236 of the counterpole 228 and can be coupled to the surface using, for example, an adhesive.

Referring again to FIG. 3, in some embodiments, as shown, the recesses 238 can be spaced apart equally around the optical axis 218 such that they form a symmetrical pattern. In other embodiments, the recesses 238 can be disposed asymmetrically about the optical axis 218. The magnets 234 can be disposed symmetrically or asymmetrically within the recesses 238. For example, the asymmetric disposition of the magnets 234 within the recesses 238 about the optical axis 218 can be used to compensate for asymmetry in other components of the optical system. For example, in the embodiment illustrated in FIG. 3, the counterpole 228 comprises twelve recesses 238, three of which have magnets 234 disposed within them to form an asymmetrical pattern.

Figure 4:
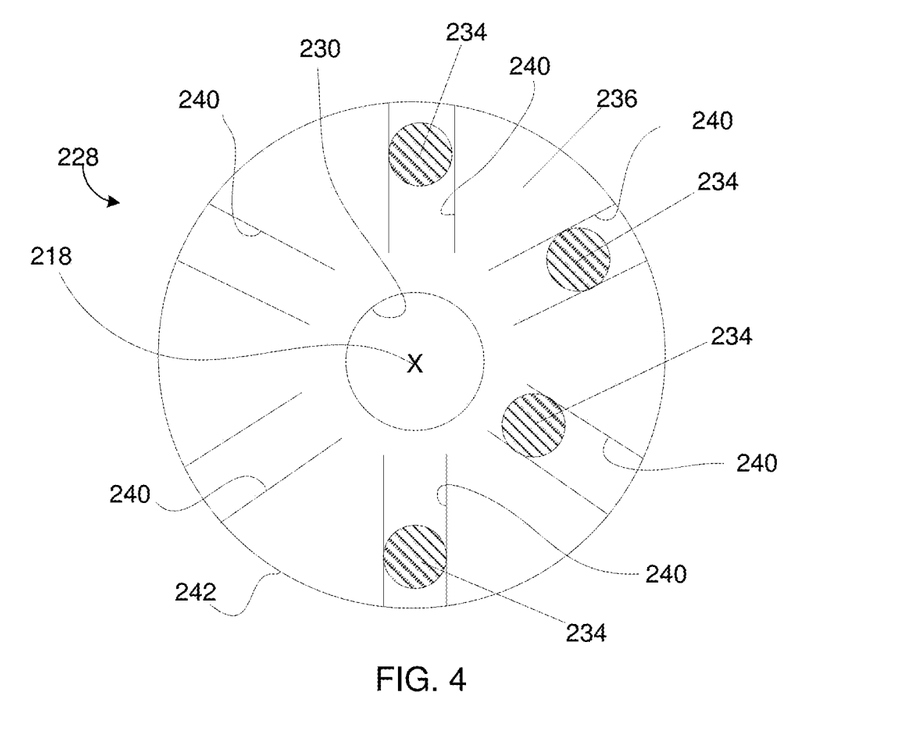
FIG. 4 is a top plan view of another embodiment of a counterpole for an SEM system.

In some embodiments, as shown in FIG. 4, recesses can be configured as tracks 240 extending radially from a position adjacent the optical axis 218 to an edge 242 of the counterpole 228. Each track 240 can be configured such that a respective magnet 234 can slide radially inwardly or outwardly relative to the optical axis 218 within the track 240. Such a configuration advantageously allows the magnets to easily be repositioned and/or adjusted relative to the axis 218 to compensate for any existing asymmetry in the system 200. In some embodiments, more than one magnet can be disposed in each track 240. Though the illustrated embodiment shows a plurality of tracks 240 extending in a radial direction, in other embodiments, the tracks can extend circumferentially about the optical axis 218.

In some embodiments, as mentioned, the counterpole 228 can be movable relative to the sample S. For example, the counterpole 228 can be movable such that it can be fully removed from the sample chamber and/or can be stored in a "parking bay" connected to the sample chamber. In some embodiments, the counterpole 228 can be moved from a first location within the vacuum chamber wherein the counterpole 228 is disposed near enough the magnetic immersion lens 212 to add additional magnetomotive force to the immersion lens (e.g., an "active" location) to a second location within the vacuum chamber wherein the counterpole 228 does not affect the lens 212 (e.g., an "inactive" location). The counterpole 228 can be energized by the immersion lens 212 (e.g., the counterpole 228 can be part of the magnetic path of the immersion lens and does not need to be energized by a separate magnetic field such as an auxiliary magnetic coil).

In other embodiments, permanent magnets 234 can be disposed on a retractable optical element. Details of such configurations can be found in U.S. Patent Publication 2014/0110597, which is incorporated by reference herein in its entirety.

While system 200 is shown only to include an SEM column, in some embodiments, the system 200 can further comprise an ion column, similar to ion column 104 of dual-beam system 100, described previously. In such embodiments, the magnetic immersion lenses described herein (including the counterpole 228 with permanent magnets 234) can be used to focus an ion beam from the ion column.

Example 3

Figure 6:
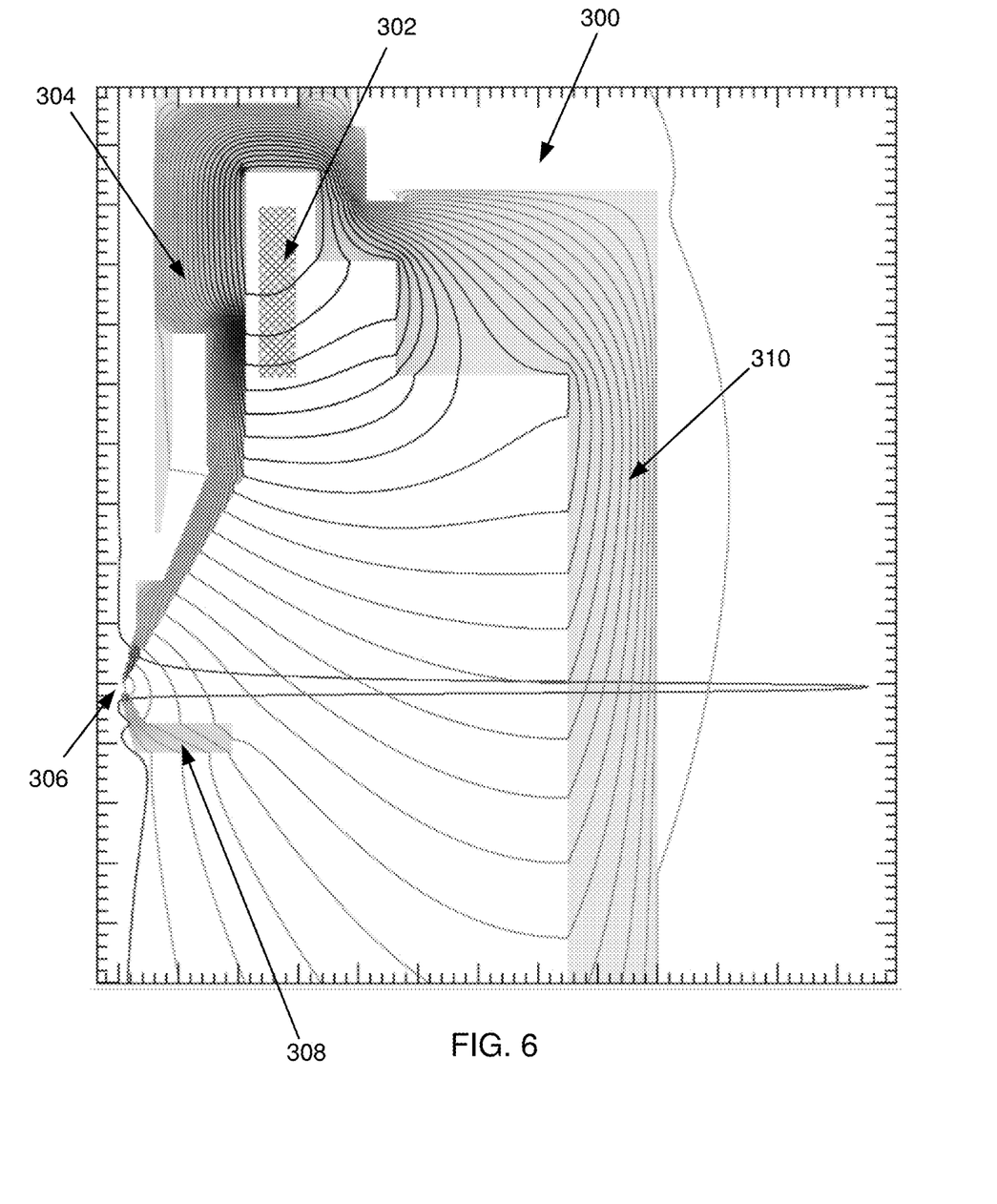
FIG. 6 is a graph of the magnetic field of a portion of an exemplary SEM system.

FIG. 6 illustrates a representative graph of the magnetic flux lines of an exemplary system 300. The area 302 corresponds to the coil 222, the flux lines shown in area 304 correspond to flux lines in the first lens pole 224, the flux lines shown in area 308 correspond to flux lines in the second lens pole 228, and the flux lines shown in the area 310 correspond to flux lines in the vacuum chamber 204. As shown, the area 302 illustrates the limited power of the existing immersion lens coil. The magnetic field strength within the first pole of the lens is shown at area 304. Area 306 illustrates the saturation of the immersion lens' magnetic circuit. Such saturation and possible consequent magnetic circuit asymmetry can negatively affect the performance of the lens. The embodiments described herein are configured to address these issues and advantageously allow the magnets to be used inside the column itself, with a partially open magnetic circuit.

Figure 7:
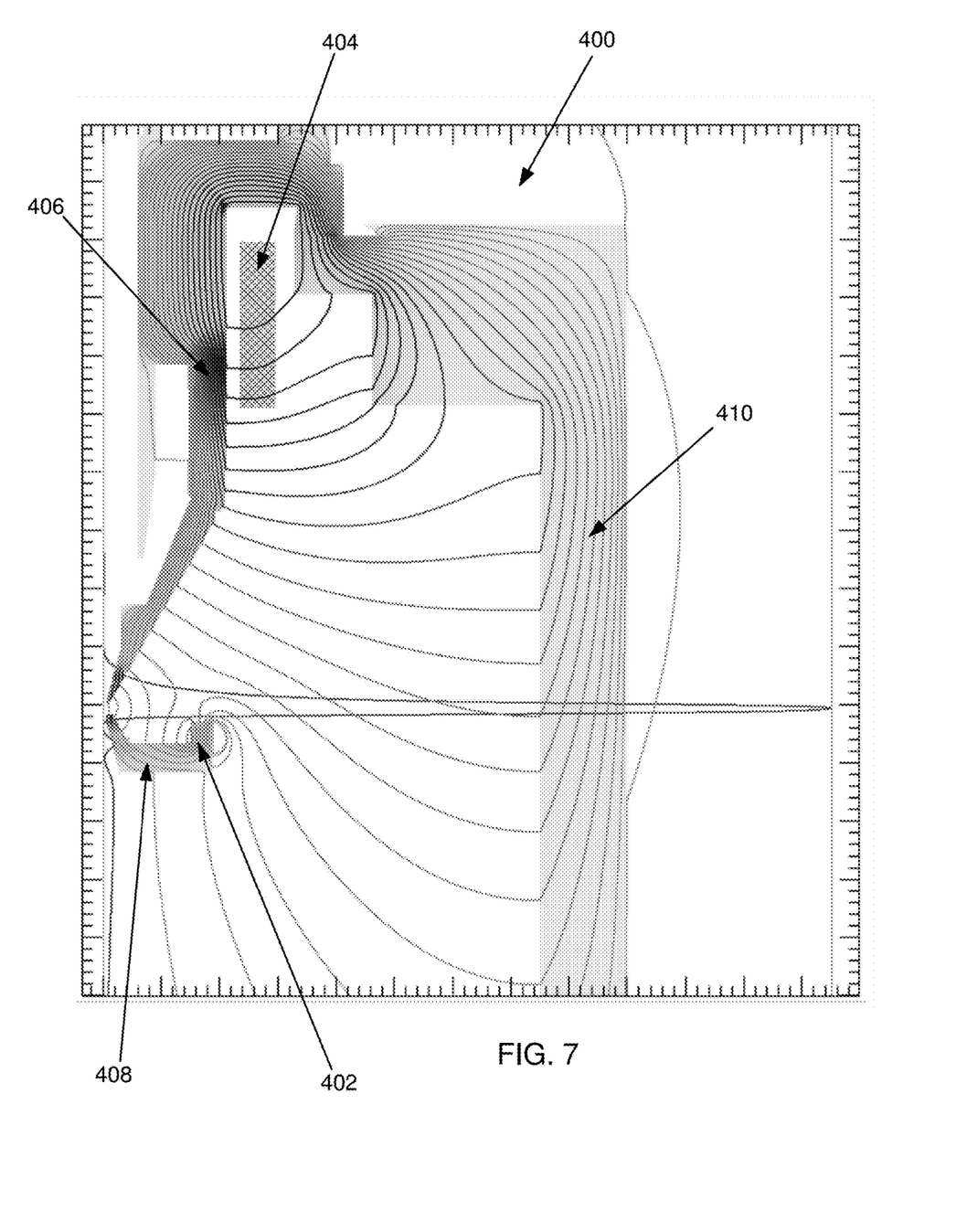
FIG. 7 is a graph of the magnetic field of a portion of an exemplary SEM system comprising one or more permanent magnets.

For example, FIG. 7 illustrates a representative graph of the magnetic flux lines of an exemplary system 400 that includes permanent magnets. The flux lines in area 402 correspond to the flux lines in the permanent magnets 234, the area 404 corresponds to the coil 222, the flux lines shown in area 406 correspond to flux lines in the first lens pole 224, the flux lines shown in area 408 correspond to flux lines in the second lens pole 228, and the flux lines shown in area 410 correspond to flux lines in the vacuum chamber 204. The area 402 shows the magnetic field strength added by the permanent magnets 234, which can add the equivalent of, for example, about 1500 AT of coil.

In view of the many possible embodiments to which the principles of the disclosure may be applied, it should be recognized that the illustrated embodiments are only preferred examples and should not be taken as limiting the scope. Rather, the scope is defined by the following claims. We therefore claim all subject matter that comes within the scope and spirit of the appended claims. Alternatives specifically addressed in the above examples are merely illustrative and do not constitute all possible alternatives to the embodiments described herein.

The invention claimed is:

1. A charged particle beam system, comprising:
   a vacuum chamber;
   a specimen holder for holding a specimen within the vacuum chamber; and
   a charged particle column comprising a charged particle source for producing a beam of charged particles along an optical axis and a magnetic immersion lens for focusing the beam of charged particles, the magnetic immersion lens comprising:
      a first lens pole disposed adjacent a first surface of the specimen,
      an excitation coil surrounding the first lens pole, and
      a counterpole configured to be disposed adjacent a second surface of the specimen, the counterpole including one or more magnets disposed on a surface of the counterpole asymmetrically with respect to the optical axis.

2. The system of claim 1, wherein the surface of the counterpole is a first surface and wherein one or more additional magnets are disposed on a second surface of the counterpole opposing the first surface.

3. The system of claim 1, wherein the counterpole comprises one or more recesses and wherein each magnet is disposed within a respective recess on the surface of the counterpole.

4. The system of claim 1, wherein the one or more magnets are coupled to the counterpole via an adhesive.

5. The system of claim 1, wherein the counterpole is mounted to a positioning system configured to allow movement of the counterpole between first and second positions within the vacuum chamber, wherein the counterpole is inactive in the first or second position.

6. The system of claim 1, wherein the counterpole further comprises an aperture and a detector, the detector disposed within or below the aperture.

7. The system of claim 1, wherein the magnets are disposed such that they compensate for asymmetry of the system.

8. The system of claim 1, wherein the magnets are disposed such that they create asymmetry in the system.

9. The system of claim 1, wherein the one or more magnets comprise a plurality of magnets disposed on a first surface of the counterpole.

10. A charged particle beam system, comprising:
    a vacuum chamber;
    a specimen holder for holding a specimen within the vacuum chamber; and
    a charged particle column comprising a charged particle source for producing a beam of charged particles along an optical axis and a magnetic immersion lens for focusing the beam of charged particles, the magnetic immersion lens comprising:
       a first lens pole disposed adjacent a first surface of the specimen,
       an excitation coil surrounding the first lens pole, and
       a counterpole configured to be disposed adjacent a second surface of the specimen, the counterpole including one or more magnets disposed within respective recesses on the surface of the counterpole; and
    wherein the recesses comprise tracks and wherein the one or more magnets are slidable within the tracks such that the magnets can be positioned relative to the optical axis.

11. The system of claim 10, wherein each track extends radially inwardly from an outer edge of the counterpole toward the optical axis.

12. The system of claim 10, wherein each track extends circumferentially around the optical axis.

13. A dual beam system, comprising:
    a specimen holder for holding a specimen;
    an ion beam column configured to direct an ion beam to the specimen; and
    a charged particle column comprising a charged particle source for producing a beam of charged particles along an optical axis and a magnetic immersion lens for focusing the beam of charged particles, the magnetic immersion lens comprising:
       a first lens pole disposed adjacent a first surface of the specimen, and
       a second lens pole disposed adjacent a second surface of the specimen, the second lens pole comprising one or more magnets disposed asymmetrically relative to the optical axis.

14. The system of claim 13, wherein the one or more magnets comprise a plurality of magnets disposed on a first surface of the second lens pole and wherein one or more additional magnets are disposed on a second surface of the second lens pole.

15. The system of claim 13, wherein the second lens pole comprises one or more recesses and wherein each magnet is disposed within a respective recess.

16. The system of claim 13, wherein the dual beam system further comprises a vacuum chamber and wherein the second lens pole is mounted to a positioning system configured to allow movement of the second lens pole between first and second positions within the vacuum chamber, wherein the second lens pole is inactive in the first or second position.

17. The system of claim 13, wherein the second lens pole further comprises an aperture and a detector, the detector disposed within or below the aperture.

18. The system of claim 13, wherein the magnetic immersion lens is coupled to a control unit.

19. A method of using the dual beam system of claim 13, comprising: disposing the magnets about the optical axis to create asymmetry within the system.

* * * * *